(12) United States Patent
Yamoto et al.

(10) Patent No.: US 6,399,429 B1
(45) Date of Patent: Jun. 4, 2002

(54) METHOD OF FORMING MONOCRYSTALLINE SILICON LAYER, METHOD FOR MANUFACTURING SEMICONDUCTOR DEVICE, AND SEMICONDUCTOR DEVICE

(75) Inventors: Hisayoshi Yamoto; Hideo Yamanaka; Yuichi Satou; Hajime Yagi, all of Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/486,619

(22) PCT Filed: Jun. 30, 1999

(86) PCT No.: PCT/JP99/03522

§ 371 (c)(1),
(2), (4) Date: Feb. 29, 2000

(87) PCT Pub. No.: WO00/01005

PCT Pub. Date: Jan. 6, 2000

(30) Foreign Application Priority Data

Jun. 30, 1998 (JP) .......................... 10/184468
Jan. 14, 1999 (JP) .......................... 11/008511

(51) Int. Cl.[7] .................. H01L 21/00; H01L 21/84
(52) U.S. Cl. ....................... 438/166; 438/311
(58) Field of Search ............ 438/166, 30, 197, 438/153, 266, 308, 311, 604, 680, 743, 795, 930

(56) References Cited

U.S. PATENT DOCUMENTS 3,885,061 A   5/1975   Corboy et al.
4,169,746 A   10/1979  Ipri et al.
4,371,421 A   2/1983   Fan et al.

(List continued on next page.)

FOREIGN PATENT DOCUMENTS

EP   1477856   6/1977
EP   1540675   2/1979
EP   0486019   5/1992

(List continued on next page.)

OTHER PUBLICATIONS

R. P. Zingg, et al., "First MOS Transistors on Insulator by Silicon Saturated Liquid Solution Epitaxy", IEEE ELECTRON DEVICE LETTERS, vol. 13, No. 5, May 1992, p. 294–6.

Masakiyo Matsumura, "Thin Film Transistor", OYO BUTURI, vol. 65, No. 8 (1996) pp. 842–848.

Soo Hong Lee, "Very Low Temperature Liquid Phase Epitaxial Growth of Silicon", MATERIALS LETTERS, vol. 9, No. 2,3 (Jan. 1990) pp. 53–56.

R. Bergmann, et al., "MOS Transistors with Epitaxial Si, Laterally Grown Over SiO2 by Liquid Phase Epitaxy", J. Applied Physics A, vol. A54, No. 1, p. 103–5.

G. A. Garcia, et al., "High–Quality CMOS in Thin (100nm) Silicon on Sapphire", IEEE ELECTRON DEVICE LETTERS, vol. 9, pp. 32–34, Jan. 1998.

(List continued on next page.)

Primary Examiner—David Nelms
Assistant Examiner—David Nhu
(74) Attorney, Agent, or Firm—Sonneschein, Nath & Rosenthal

(57) ABSTRACT

Single-crystal silicon is deposited on an insulating substrate (1) with a crystalline sapphire layer (50) formed thereon as a seed, to form a silicon epitaxial layer (7). P-type impurity ions are implanted into a single-crystal silicon layer, and then N-type impurity ions are implanted to make a P-channel MOS transistor portion a single-crystal silicon layer (14). In a single-crystal silicon layer (11), an N+ source region (20) and drain region (21) of an N-channel MOS transistor are formed. Thus, a silicon layer is epitaxially grown uniformly at low temperatures.

52 Claims, 13 Drawing Sheets

U.S. PATENT DOCUMENTS

| | | | |
|---|---|---|---|
| 4,383,883 A | | 5/1983 | Mizutani |
| 4,469,527 A | | 9/1984 | Sugano et al. |
| 4,534,820 A | | 8/1985 | Mori et al. |
| 5,242,844 A | * | 9/1993 | Hayashi ..................... 438/151 |
| 5,294,285 A | | 3/1994 | Kanai et al. |
| 5,488,243 A | * | 1/1996 | Tsuruta et al. ............... 257/314 |
| 5,588,994 A | * | 12/1996 | Bozler et al. ................. 117/89 |
| 5,616,506 A | | 4/1997 | Takemura |
| 6,103,558 A | * | 8/2000 | Yamanaka et al. .......... 438/166 |

FOREIGN PATENT DOCUMENTS

| | | |
|---|---|---|
| EP | 0723039 | 7/1996 |
| JP | 457098 | 7/1985 |
| JP | 63-10314 | 2/1988 |
| JP | 63040314 | 2/1988 |
| JP | 8-250438 | 9/1996 |
| JP | 9-50960 | 2/1997 |
| JP | 9-129558 | 5/1997 |
| JP | 10-167893 | 6/1998 |

OTHER PUBLICATIONS

K. Izumi, et al, "CMOS Device Fabrication on Buried SiO2 layers formed by Oxygen Implantation into Silicon", ELECTRON. LETT., vol. 14, No. 18, pp 593–594, Aug. 1978.

S. Furukawa, "Graphoepitaxy", THE TRANSACTIONS OF THE INSTITUTE OF ELECTRONICS, INFORMATION AND COMMUNICATION ENGINEERS, vol. 66, No. 5, pp. 486–489 (May 1983).

Geis et al., "Crystallographic Orientation of Silicon on an Amorphous Substrate Using an Aritificial–Relief Grafting and Laser Crystallization", APPL. PHYS. LETTER, 35, 1 pp. 71–74 (Jul. 1979).

Geis, et al., "Silicon Graphoepitaxy", JPN J. APPL. PHYS. SUPPL., 20–1 pp. 39–42 (1981).

Homma et al., "A Room Temperature CVD Technology for Interlayer in Deep–Submicron Multilevel Interconnection", International Electron Device Meeting, Dec. 8–11, 1991, pp. 289–292.

Hattori et al., "Noise Reduction of pHEMTs with Plasmaless SiN Passivation by Catalytic CVD", $19^{th}$ Annual GaAs IC Symposium, Oct. 12–15, 1997, pp. 78–80.

* cited by examiner sample — 1

METHOD OF FORMING MONOCRYSTALLINE SILICON LAYER, METHOD FOR MANUFACTURING SEMICONDUCTOR DEVICE, AND SEMICONDUCTOR DEVICE

FIELD OF THE INVENTION

The present invention relates to a method of forming a single-crystal silicon layer and a method of manufacturing a semiconductor device, and a semiconductor device. Specifically, the invention relates to methods suitable for manufacturing a semiconductor device such as an insulated gate field effect transistor using a single-crystal silicon layer grown epitaxially on an insulating substrate for an active region, and relates to such a semiconductor device.

BACKGROUND OF THE INVENTION

A TFT (Thin Film Transistor) is a MOSFET (Metal-oxide-semiconductor field effect transistor) using a single-crystal silicon layer formed on a substrate. As is known in the conventional art, a TFT exhibits an electron mobility several times greater than a transistor utilizing a polysilicon layer, and is suitable for high speed operations (see the following references, R. P. Zingg et al, "First MOS transistors on Insulator by Silicon Saturated Liquid Solution Epitaxy". IEEE ELECTRON DEVICE LETTERS. VOL. 13, NO. 5, MAY 1992 p294–6., Publication of Examined Japanese Patent Application No. Hei 4-57098, Masakiyo Matsumura, "Thin Film Transistor," OYO BUTURI, Vol. 65, No. 8 (1996) pp842–848).

There are five deposition methods for forming a single-crystal silicon layer for such a semiconductor element:

(1) growing single-crystal silicon through the decomposition of silane, dichlorosilane, trichlorosilane, silicon tetrachloride at a temperature of about 800–1200° C. in a hydrogen atmosphere at pressures of 100–760 Torr.

(2) forming a silicon epitaxial layer on a single-crystal silicon substrate as a seed by the cooling of a solution of indium and silicon or a solution of indium, gallium and silicon heated to 920–930° C., and then forming a silicon semiconductor layer thereon (see the following references: Reference 1, Soo Hong Lee, "VERY-LOW-TEMPERATURE LIQUID-PHASE EPITAXIAL GROWTH OF SILICON". MATERIALS LETTERS. Vol. 9. No. 2,3 (January, 1990) pp53–56. Reference 2, R. Bergmann et al, "MOS transistors with epitaxial Si, laterally grown over $SiO_2$ by liquid phase epitaxy." J. Applied Physics A, vol. A54, no. 1 p. 103–5. Reference 3, R. P. Zingg et al, "First MOS transistors on Insulator by Silicon Saturated Liquid Solution Epitaxy." IEEE ELECTRON DEVICE LETTERS. VOL. 13, NO. 5, MAY 1992 p294–6.).

(3) growing silicon epitaxially on a sapphire substrate (see Reference 4, G. A. Garcia, R. E. Reedy, and M. L. Burger, "High-quality CMOS in thin (100 nm) silicon on sapphire," IEEE ELECTRON DEVICE LETTERS. VOL. 9, pp32–34, January 1988.).

(4) forming a silicon layer on an insulating layer by oxygen ion implantation (see Reference 5, K. Izumi, M. Doken, and H. Ariyoshtl, "CMOS device fabrication on buried $SiO_2$ layers formed by oxygen implantation into silicon," Electron. Lett., vol. 14, no. 18, pp593–594, August 1978.).

(5) forming a step on a quartz substrate and then forming thereon a polysilicon layer, which is then heated to 1400° C. or higher by laser beams or a strip heater to form an epitaxial layer on the step formed on the quartz substrate as a seed (see the following references: Reference 6, Seijiro Furukawa, "Graphoepitaxy," The Transactions of the Institute of Electronics, Information and Communication Engineers, Vol. 66, No. 5, pp486–489. (1983. May). Reference 7, Geis, M. W., et al.: "Crystallographic orientation of silicon on an amorphous substrate using an artificial-relief grating and laser crystallization", Appl. Phys. Letter, 35, 1, pp71–74 (July 1979). Reference 8, Geis, M. W., et al.: "Silicon graphoepitaxy", Jpn. J. Appl. Phys., Suppl. 20–1 pp.39–42 (1981).).

According to already known methods, all of the energy required for chemical reactions/single crystal growth is supplied in the form of heat energy (supplied by heating). This causes a problem that the epitaxial-growth temperature cannot be reduced to temperatures considerably lower than about 800° C., more particularly 700° C. This prevents epitaxial growth on, for example, a substrate kept at low temperatures or development of a method for forming a silicon epitaxial layer on a large glass plate which has a relatively low strain point. On the other hand, the method of growing silicon on a step formed on a glass plate as a seed to start epitaxial growth cannot attain the uniform epitaxial growth of silicon at a low temperature.

SUMMARY OF THE INVENTION

The invention has been achieved to overcome the above-described shortcomings. An object of the invention is to provide a method of forming a single-crystal silicon layer and a method of manufacturing a semiconductor device, and a semiconductor device, capable of the uniform epitaxial growth of a silicon layer at a low temperature on a large glass substrate with a relatively low strain point to enable the formation of a high-speed semiconductor element of a large current density thereon.

A method of forming a single-crystal silicon layer of the invention involves the formation of a single-crystal silicon layer on a seeding layer made of a material having a lattice match with a single[0a‰3]rystal silicon layer by CAD (Chemical Vapor Deposition) using a catalyst.

Another method of forming a single-crystal silicon layer of the invention entails the formation of a single-crystal silicon layer on a single-crystal silicon substrate by CAD using a catalyst.

A method of manufacturing a semiconductor device of the invention includes the above-stated step of forming a single-crystal silicon layer, and a subsequent step of manufacturing a semiconductor element through a predetermined treatment of the single-crystal silicon layer.

A semiconductor device of the invention comprises: an insulating substrate; a seeding layer made of a material having a lattice match with single-crystal silicon, the seeding layer formed on the insulating substrate; a single-crystal silicon layer formed on the seeding layer, the single-crystal silicon layer forming a semiconductor element.

According to the present invention, single-crystal silicon is deposited (grown epitaxially) on a seeding layer made of a material having a lattice match with single-crystal silicon (for example, a crystalline sapphire layer) or a single-crystal silicon bulk substrate as a seed by CAD using a catalyst. This enables several outstanding effects and advantages to be obtained, which are as in the followings:

(A) the seeding layer as a seed to start silicon epitaxial growth can be formed by low-pressure CAD (CAD at a low pressure: where the temperature of the substrate is 500–600° C.). In addition, on the seeding layer or a single-crystal silicon substrate, a single-crystal silicon layer can be formed by a low-temperature deposition method, that is, CAD using a catalyst (in which the temperature of the substrate is 100–700° C. and preferably 200–600° C.). This enables the uniform formation of a single-crystal silicon layer on a substrate at a low temperature. Especially, the seeding layer such as a crystalline sapphire layer or a single-crystal silicon substrate makes silicon epitaxial growth easy, having an excellent lattice match with single-crystal silicon particularly because of a lattice constant equal to that of single-crystal silicon.

(B) this makes it possible to use a substrate easily and cheaply available and made of a material of excellent properties, such as a glass substrate having a relatively low strain point, a ceramic substrate or a single-crystal silicon bulk substrate. Of course, a substrate made of quartz glass can be used. Besides, it becomes possible to use a substrate of long dimension more than 100 m or of larger surface area larger than 1 m². This enables the formation of a continuous single-crystal silicon layer on a glass substrate in the form of a roll of wide and long dimensions.

(C) single-crystal silicon can be grown at low temperatures, preventing auto-doping of impurities to simplify the process (specifically, a step of sealing the back of a high-concentration substrate is no longer necessary).

(D) the quality of a silicon epitaxial layer can be improved. Specifically, a decrease in diffusion of impurities contributes to more precise control of the concentration and the thickness of a silicon epitaxial layer. Especially in the case of forming a silicon epitaxial layer on a sapphire substrate, strains caused by heat can be reduced, further suppressing auto-doping of aluminum.

(E) low substrate temperatures (100–700° C. in CAD using a catalyst, 1000–1200° C. in the conventional art) can reduce heating power requirements. Also, a cooling mechanism can be simplified, making a silicon epitaxy system cheaper.

(F) large reaction efficiency (several tens of percentage in CAD using a catalyst, a few percents or less in the conventional CAD) of reaction gases such as silane saves resources and has a low impact on the environment. This also contributes to a cost reduction.

(G) the seeding layer such as a crystalline sapphire layer also serves as a barrier to diffusion of various atoms, suppressing diffusion of impurities from a glass substrate or other substrates.

(H) the electron mobility in a single-crystal silicon layer formed on a glass substrate or others at a low temperature is as big as 540 cm²/v·sec (see Reference 3 above), which is equivalent to that of a single-crystal silicon substrate. Therefore, it becomes possible to fabricate a top-gate, bottom-gate or dual-gate TFT for a LCD (Liquid Crystal Display), which is high-speed and has a large current density, a transistor for an EL (Electro luminescence) or a FED (Field Emission Display), a high-performance semiconductor element such as a diode, a solar cell, a capacitor or a resistor and the like, or integrated circuits on a glass substrate.

Other objects and advantages of the present invention will become apparent from reading the following detailed description and appended claims, and upon reference to the accompanying drawings.

Figure 1A:
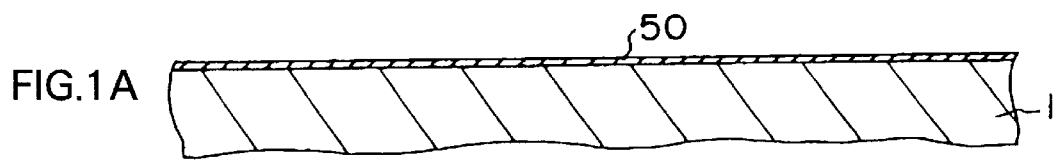
FIG. 1A and FIG. 1B are sectional views illustrating steps of a process of manufacturing semiconductor device according to a first embodiment of the invention in order.

It should be understood that the drawings are not necessarily to scale and that the embodiments are sometimes illustrated by graphic symbols, phantom lines, diagrammatic representations and fragmentary views. In certain instances, details which are not necessary for an understanding of the present invention or which render other details difficult to perceive may have been omitted. It should be understood, of course, that the invention is not necessarily limited to the particular embodiments illustrated herein.

DETAILED DESCRIPTION OF THE PRESENTLY PREFERRED EMBODIMENTS

A method of forming a single-crystal silicon layer according to the present embodiment involves forming a single-crystal silicon layer by CAD using a catalyst (where the temperature of the substrate is about 100–700° C. and preferably 200–600° C.). In forming a single-crystal silicon layer by CAD using a catalyst, it is preferable that a gas containing mainly silicon hydride is decomposed through contact with a catalyst body heated to 800–2000° C., for example, 1600–1800° C. (lower than the melting point thereof) to deposit a single-crystal silicon layer on the substrate.

Silicon hydride is silane (for example, monosilane, disilane, trisilane), and a catalyst body is at least one kind of material selected from the group consisting of tungsten, tungsten containing thorium oxide, molybdenum, platinum, palladium, silicon, alumina, ceramics with metal attached thereto, and silicon carbide.

The embodiment enables the use of an insulating substrate, especially a glass substrate having a low strain point, enabling the formation of a semiconductor crystal layer on a large glass substrate having a surface area of 1 m$^2$ or more. In the embodiment, the temperature of a substrate through the process by CAD using a catalyst is low, which makes it possible to use a glass substrate made of glass having a strain point as low as 470–670° C. Glass of this type is cheap and easily formed into a thin plate. Using this glass, therefore, enables the formation of a glass plate in the form of a roll of long dimension. On a glass plate in the form of a roll of long dimension, continuous or discontinuous thin epitaxial layers can be formed by a method of the embodiment.

The embodiment also involves forming a seeding layer made of a material selected from the group consisting of crystalline sapphire, a spinel structure and calcium fluoride, or made of single-crystal silicon. The seeding layer can be formed in the form of thin film on an insulating substrate such as a glass substrate. The seeding layer, however, may be a bulk substrate itself.

In this case, preferably, the single-crystal silicon layer is formed after removing an oxide film such as a natural oxide film on the surface of the seeding layer made of single-crystal silicon or the silicon substrate. One method is to remove a natural oxide film by etching with an etchant of hydrogen atoms activated through contacting hydrogen gas with a heated catalyst body, before forming the single-crystal silicon layer by CAD using a catalyst according to the embodiment.

The present embodiment also enables the manufacture of a semiconductor element through a predetermined treatment of a single-crystal silicon layer, which has been deposited on the seeding layer or a single-crystal silicon substrate as a seed.

In the process of deposition of a single-crystal silicon layer, the impurity type and/or the impurity concentration of the silicon epitaxial layer to be grown, that is, the conductive type, namely, P-type or N-type, and/or the carrier density of the single-crystal silicon layer, can be optionally controlled by doping an appropriate amount of a III-group or V-group element (such as B, P, Sb, As) supplied in the form of, for example, $B_2H_6$, $PH_3$.

The present embodiment entails the application of a single-crystal silicon layer grown epitaxially on a substrate to a channel region, a source region and a drain region of an insulated gate field effect transistor, to control the impurity type and/or the impurity concentration of each region.

The seeding layer serves as a seed to start epitaxial growth of a single-crystal silicon layer. In addition, the present embodiment may involve forming a step as a seed to start epitaxial growth on a substrate such as an insulating substrate by dry etching such as reactive ion etching, and forming the seeding layer on a substrate with the step formed thereon. In this case, the step also works as a seed to start epitaxial growth of a single-crystal silicon layer. Such a step can be formed on the seeding layer. In another alternative, such a step may be formed on a single-crystal silicon substrate, a sapphire substrate or a germanium substrate itself and then a single-crystal silicon layer may be grown epitaxially on the substrate with the step formed thereon.

Description will now be made in detail of the preferred embodiments of the present invention.

First Embodiment

A first embodiment of the invention will be described by referring to FIG. 1 to FIG. 5.

The present embodiment involves the epitaxial growth of a single-crystal silicon layer on a crystalline sapphire layer formed on an insulating substrate as a seed, at a low temperature by CAD using a catalyst.

Firstly, as shown in FIG. 1A, a crystalline sapphire layer (thin film) (5–200 nm in thickness) 50 is formed on a main surface of an insulating substrate 1 (specifically, having a strain point of about 470–1400° C. and preferably 470–670° C., and having a thickness of 50 $\mu$m to several millimeters) made of, for example, quartz glass or glass-ceramics. A method to form the crystalline sapphire layer 50 is to crystallize a trimethyl aluminum gas through oxidation by oxidizing gas (oxygen•water), by known low-pressure CAD, high-density plazma-assisted CAD or CAD using a catalyst (see JP-A Sho 63–40314).

Figure 1B:
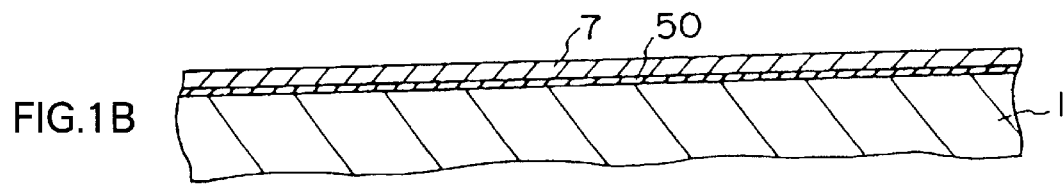

Then, as shown in FIG. 1B, a single-crystal silicon layer 7 having a thickness of several micrometers to 0.005 $\mu$m (for example, 0.1 $\mu$m) is grown epitaxially over the entire surface of the crystalline sapphire layer 50 by CAD using a catalyst (in which the temperature of the substrate is 200–800° C.) as disclosed in, for example, JP-A No. Sho 63–40314.

Figure 5:
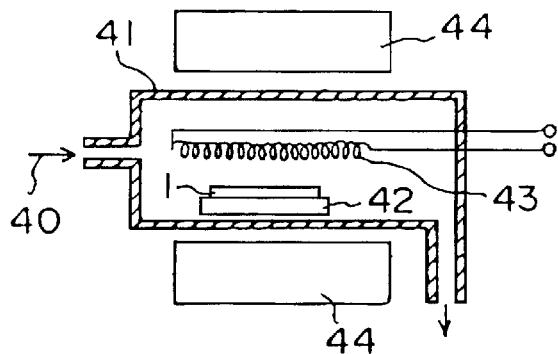
FIG. 5 illustrating schimatically a CAD system using a catalyst, used for manufacturing a semiconductor device according to a first embodiment of the invention.

The process by CAD using a catalyst is conducted using a CAD system using a catalyst as shown in FIG. 5. In the CAD system using a catalyst, silicon hydride (for example, monosilane) gas 40 (and hydrogen, or a doping gas such as $B_2H_6$ or $PH_3$ included as necessary) is introduced from a supply pipe to a deposition chamber 41. Inside the deposition chamber 41, provided are a susceptor 42 for supporting the substrate 1 and a coil-like catalyst body 43 arranged facing the susceptor 42. The substrate 1 is heated by an external heating means 44 (for example, electric heating means). The catalyst body 43, which is, for example, a resistance wire, is activated by being heated up to a temperature below the melting point thereof (specifically 800–2000° C., for example, 1600–1800° C., about 1800° C. if tungsten is used).

The specific procedure is as follows: first, the glass substrate 1 with a crystalline sapphire layer formed thereon is mounted on a substrate 42 (usually, SiC-coated graphite susceptor at a temperature of 200° C.) through a load-lock chamber. The substrate 42 is capable of control of the temperature in the chamber 41.

Then the pressure in the chamber is reduced to the order of 1–2×10$^{-6}$ Pa. and particularly water/oxygen introduced in the chamber is exhausted (for about 5 minutes). After that, hydrogen is allowed to flow into the chamber. The flow rate of hydrogen, the pressure in the chamber and the susceptor temperature are controlled to prescribed values as follows:

Pressure in the chamber: in the order of 0.1–15 Pa.
(in the embodiment, set at 1.0 Pa.)

Susceptor temperature: 100–700 ° C.
(in the embodiment, set at 200° C.)
Flow rate of hydrogen: set at 90 sccm/min Next, the catalyst body (for example, a tungsten wire) 43 is heated. The catalyst temperature is increased to about 1600–1800° C. (in this embodiment, the catalyst temperature is set at 1800° C.) and maintained for 10 minutes.

Then, hydrogen flowing in MFC (Mass Flow Controller) for SiH, is replaced with $SiH_4$ to deposit a single-crystal silicon layer having a predetermined thickness. In this embodiment, the thickness of the single-crystal silicon layer is set to 0.1 μm, and therefore, the following gases for reactions are allowed to flow in the chamber for exactly 166 seconds:

Flow rate of hydrogen: 90 sccm/min.
Flow rate of $SiH_4$: 9 sccm/min. (100% silane)
Deposition rate: 600 Å/min.

After completion of deposition, the flow rate of $SiH_4$ is reduced to zero. Five minutes later, power to the catalyst is shut off to reduce the temperature thereof.

Then the flow rate of hydrogen is reduced to zero and the pressure in the chamber is reduced to about $1-2\times10^{-6}$ Pa. Particularly $SiH_4$ introduced in the chamber is exhausted (for about 5 minutes). After that, the glass substrate on which a single-crystal silicon layer is formed with the crystalline sapphire layer in between is taken out to the outside at atmospheric pressure through the load-lock chamber.

Thus, a catalytic reaction or heat decomposition by the catalyst body 43 causes isolated silicon atoms or silicon atoms in clusters (and isolated hydrogen atoms or hydrogen atoms in clusters) having high energy to be formed and deposited on the crystalline sapphire layer 50 as a seed. This enables deposition of a single-crystal silicon layer at low temperatures considerably lower than the deposition temperature possible in the case with thermal CAD.

In CAD using a catalyst according to the present embodiment, the energy required to form a silicon epitaxial layer can be supplied in two steps. In the first step, gases for reactions (for example, silane and hydrogen, in the case of epitaxial growth using silane gas) are activated through contact with the catalyst body 43 kept at elevated temperatures (for example, 1600–1800° C.) to form silicon atoms, or hydrogen atoms or molecules (in some cases, in clusters) having high energy. In the second step, the temperature of the substrate colliding with silicon atoms, or hydrogen atoms or molecules (in some cases, in clusters) having high energy is increased within the above-mentioned range to supply the energy required especially for silicon atoms to be oriented in accordance with the crystal orientation of the substrate. In conventional CAD, the energy is supplied only by increasing the substrate temperature, and therefore, the substrate temperature is 700–800° C. at the lowest and cannot be reduced to a temperature lower than that. In contrast, CAD using a catalyst according to the present embodiment enables a silicon epitaxial layer to be formed even at 200–600° C.

As described above, silicon is grown heteroepitaxially, as shown in FIG. 1B, with the crystalline sapphire layer 50 as a seed to deposit a single-crystal silicon layer 7 having a thickness of, for example, about 0.1 μm. Since the crystalline sapphire layer has a lattice constant nearly equal to that of single-crystal silicon, (100)-oriented silicon is grown epitaxially on the crystalline sapphire layer 50.

After depositing the (100)-oriented single-crystal silicon layer 7 on the substrate 1 as described above, a MOS transistor (TFT) using the single-crystal silicon layer 7 for a channel region is fabricated.

Figure 2A:
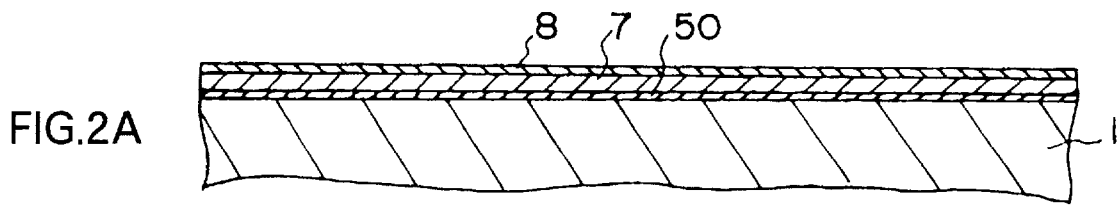
FIGS. 2A to are sectional views illustrating showing, steps of the manufacturing process continued/from FIG. 1B in order.
Figure 2B:
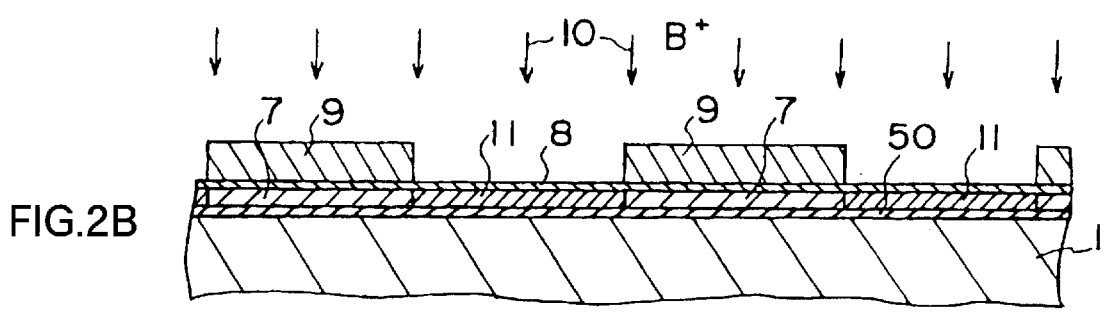

As shown in FIG. 2A, a gate oxide film 8 having a thickness of 350 Å is formed on a surface of the single-crystal silicon layer 7 by oxidation (950° C.). Next, as shown in FIG. 2B, in order to control the impurity concentration of a channel region for an N-channel MOS transistor, a region for a P-channel MOS transistor is masked with photoresist 9, and P-type impurity ions (for example, $B^+$) 10 of, for example, 10 kV is implanted with a dose of, for example, $2.7\times10^{11}$ atoms/cm$^2$ to form a single-crystal silicon layer 11, which is obtained by making the conductive type of the single-crystal silicon layer 7 P-type.

Figure 2C:
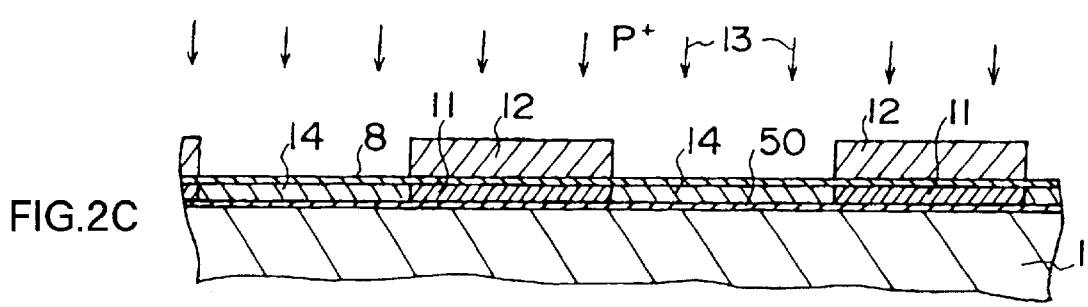

Then, as shown in FIG. 2C, in order to control the impurity concentration of a channel region for an P-channel MOS transistor, a region for an N-channel MOS transistor is masked with photoresist 12, and N-type impurity ions (for example, $P^+$) 13 of, for example, 10 kV is implanted with a dose of, for example, $1\times10^{11}$ atoms/cm$^2$ to form a silicon layer 14, which is obtained by making the conductive type of the single-crystal silicon layer 7 N-type.

Figure 3A:
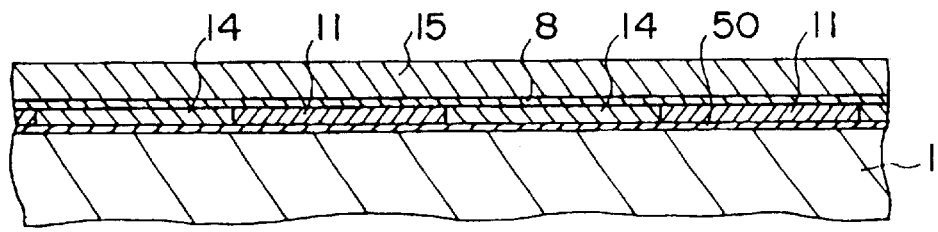
FIGS. 3A to 3D are sectional views illustrating steps of the manufacturing process continued from FIG. 2C in order.
Figure 3B:
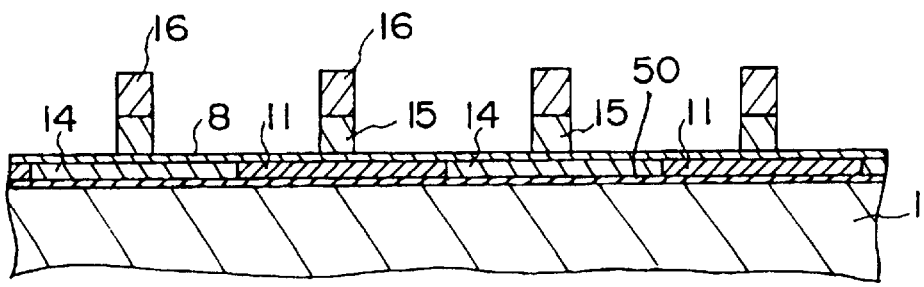
Figure 3C:
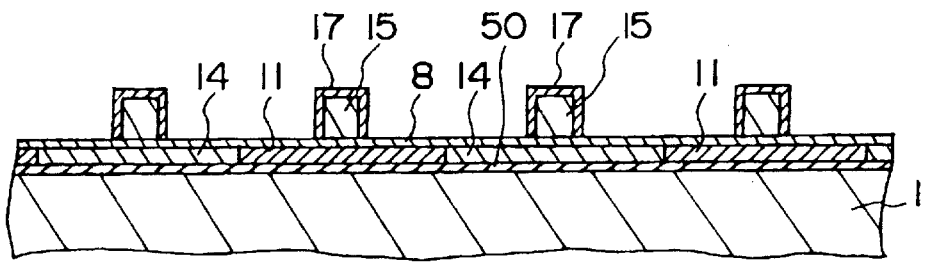

After that, as shown in FIG. 3A, a phosphorus-doped polysilicon layer 15, as a material for a gate electrode, having a thickness of 4000 Å is deposited by CAD (at a temperature of 620° C.). Then, as shown in FIG. 3B, photoresist 16 is formed in a predetermined pattern and the polysilicon layer 15 is patterned into the form of a gate electrode with the photoresist 16 used as a mask. After removing the photoresist 16, as shown in FIG. 3C, an oxide film 17 is formed on the surface of the gate polysilicon layer 15 through oxidation in an $O_2$ atmosphere, for example, at 900° C. for 60 minutes.

Figure 3D:
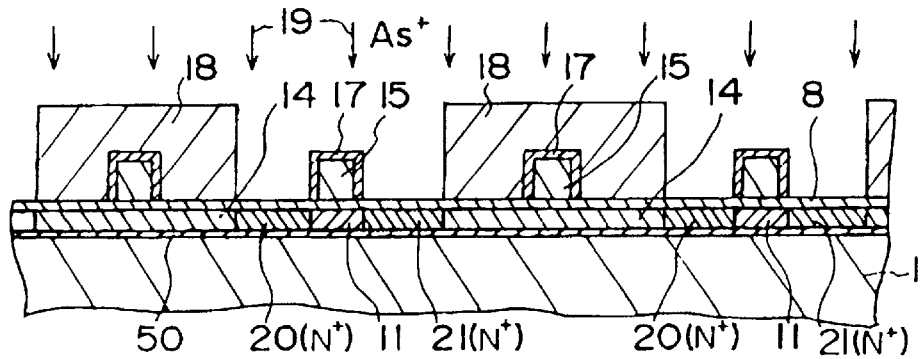

Then, as shown in FIG. 3D, the region for a P-channel MOS transistor is masked with photoresist 18, and N-type impurities such as $As^+$ ions 19 of, for example, 20 kV are implanted with a dose of, for example, $5\times10^{15}$ atoms/cm$^2$. Then, an $N^+$-type source region 20 and a drain region 21 of an N-channel MOS transistor are formed through annealing in an $N_2$ atmosphere at 950° C. for 40 minutes.

Figure 4A:
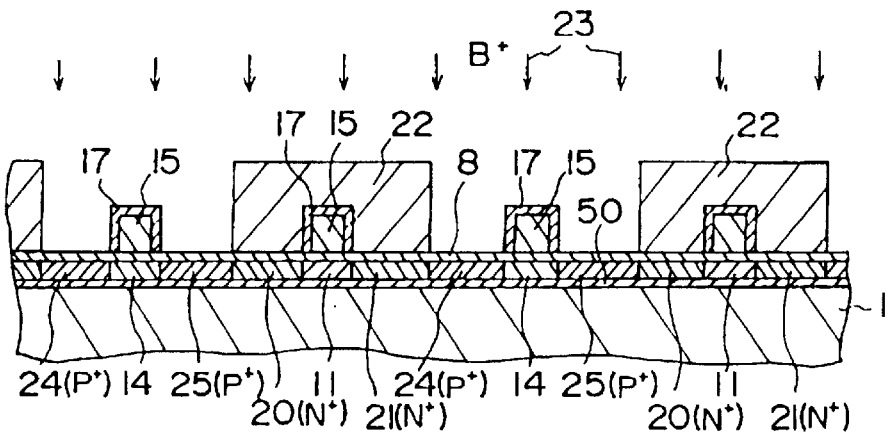
FIGS. 4A to 4C We sectional views illustrating steps of the manufacturing process continued from FIG. 3D in order.

Then, as shown in FIG. 4A, the region for an N-channel MOS transistor is masked with photoresist 22, and P-type impurities such as $B^+$ ions 23 of, for example, 10 kV are implanted with a dose of, for example, $5\times10^{15}$ atoms/cm$^2$. Then, a $P^+$-type source region 24 and a drain region 25 of a P-channel MOS transistor are formed through annealing in an $N_2$ atmosphere at 900° C. for 5 minutes.

Figure 4B:
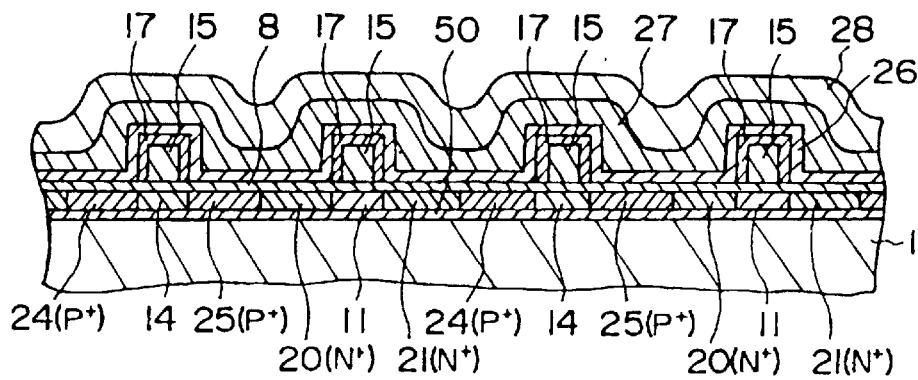

Next, as shown in FIG. 4B, over the entire surface of the wafer, by CAD, a $SiO_2$ film 26 having a thickness of 500 Å is deposited at a temperature of, for example, 750° C., and a SiN film 27 having a thickness of 2000 Å is deposited at a temperature of, for example, 420° C. In addition, a boron-phosphorous-doped silicate glass (BPSG) film 28 having a thickness of 6000 Å is formed as a reflow film at, for example, 450° C. and then the BPSG film 28 is reflowed in a $N_2$ atmosphere at 900° C., for example.

Figure 4C:
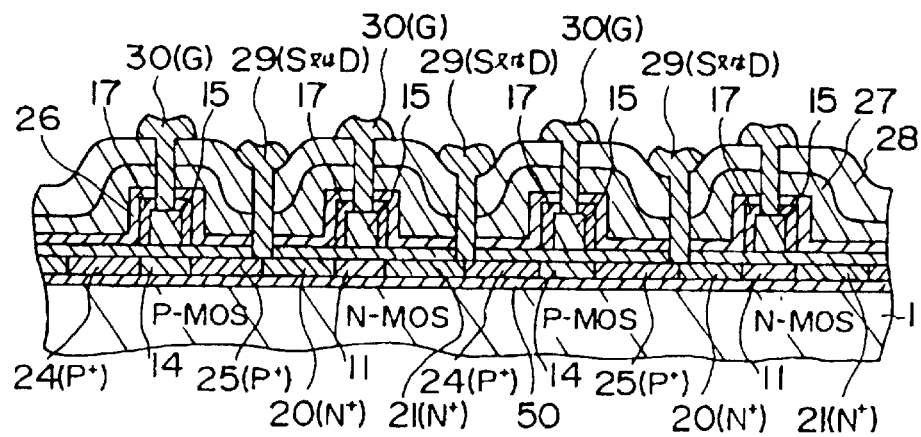

Lastly, as shown in FIG. 4C, contact windows are opened in predetermined positions in an insulating film, and then over the entire surface with the holes opened therein a film made of a material for electrodes such as aluminum and having a thickness of 1 μm is deposited by sputtering at 150° C. and patterned to form source and drain electrodes 29 (S and D) and a gate electrode or wiring 30 (G) of each of a P-cannel MOSTFT and an N-channel MOSTFT. Thus, each MOS transistor is completed.

The effects and advantages of the embodiment is as follows:

(a) the adoption of CAD a. catalyst nth the crystalline sapphire layer 50 as a seed enables the uniform growth of the single-crystal silicon layer 7 on the glass substrate 1 at low temperatures of 200–600° C.

(b) this enables the formation of a single-crystal silicon layer not only on a glass substrate having a low strain point but also on an insulating substrate such as a ceramic substrate, providing a wide range of selection of substrate materials which exhibit low strain points and are cheaply available and excellent in properties. It becomes also possible to use a substrate of large dimension (for example, more than 100 m in length and 50 μm in thickness) or of larger surface area (more than 1 m²).

(c) single-crystal silicon can be grown at low temperature, preventing auto-doping of impurities to simplify the procedure.

(d) the quality of the single-crystal silicon layer 7 can be improved. Specifically, a decrease in diffusion of impurities contributes to more precise control of concentration/thickness of a single-crystal silicon layer. Especially in the case of forming a single-crystal silicon layer on a sapphire layer, strains caused by heat can be reduced.

(e) low substrate temperatures (100–700° C. in CVD using a catalyst, 1000–1200° C. in the conventional art) can reduce heating power requirements. Also, a cooling mechanism is simple, making a silicon epitaxy system cheaper.

(f) large reaction efficiency (several tens of percentage in CVD using a catalyst, a few percents or less in the conventional CVD) of reaction gases such as silane saves resources and has a low impact on the environment. This also contributes to a cost reduction.

(g) the crystalline sapphire layer 50 also serves as a barrier to diffusion of atoms from the glass substrate 1 to the single-crystal silicon layer 7.

(h) the electron mobility in the single-crystal silicon layer 7 formed on a glass substrate or others is as big as 540 cm²/v·sec, which is equivalent to that of a single-crystal silicon substrate. Therefore, it becomes possible to fabricate a high-speed transistor having a large current density. It is possible to fabricate not only a transistor but also a diode, a capacitor or a resistor and the like, or integrated circuits on a glass substrate. The process of forming a silicon semiconductor element such as a MOS transistor is substantially the same as the well-known process of manufacturing a polysilicon TFT.

Second Embodiment

Description will now be made in detail of a second embodiment of the present invention by referring to FIG. 6 to FIG. 11.

The present embodiment involves forming a step as a seed to start epitaxial growth of single-crystal silicon on an insulating substrate, forming the above-described crystalline sapphire layer on the surface with the step formed therein, and growing a single-crystal silicon layer epitaxially at a low temperature with the combined effect of the crystalline sapphire layer and the step.

Figure 6A:
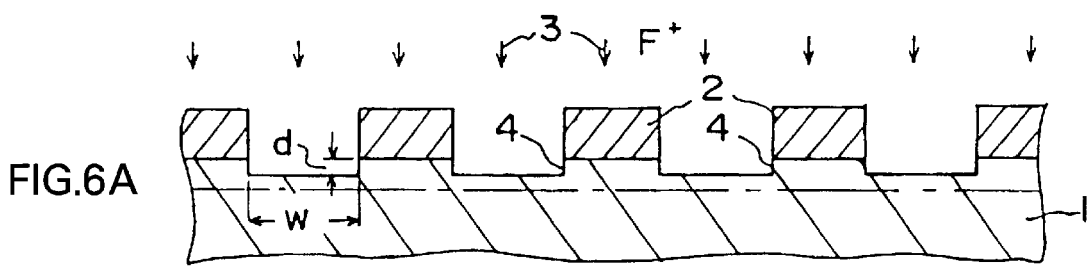
FIGS. 6A to 6C are sectional views illustrating steps of a process of manufacturing a semiconductor device according to a second embodiment of the invention in order.

Firstly, as shown in FIG. 6A, photoresist 2 is formed in a predetermined pattern on a main surface of an insulating substrate 1 made of, for example, quartz glass or glass-ceramics. Then, the substrate 1 is irradiated with F⁺ ions 3 of, for example, CF₄ plazma through the photoresist 2 as a mask, and then a plurality of steps 4 are formed on the substrate 1 by RIE (Reactive Ion Etching). In this case, the steps 4 serve as seeds used to start the epitaxial growth of single-crystal silicon as described later. The depth and width of the step 4 may be respectively 0.1 μm and 1.5–1.9 μm.

Figure 6B:
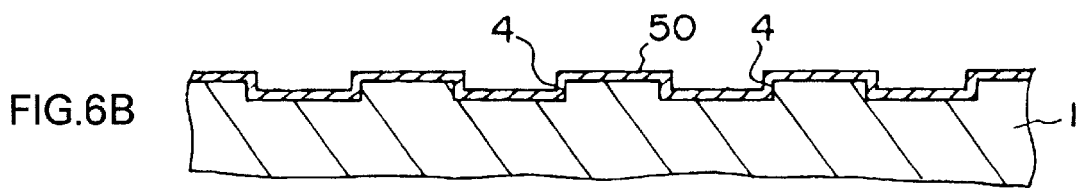

Then, as shown in FIG. 6B, after removing the photoresist 2, a crystalline sapphire layer 50 having a thickness of 5–200 nm is deposited over the entire surface with the steps 4 formed therein by known low-pressure CVD, CVD using a catalyst (in which the temperature of the substrate is about 500–650° C.) or high-density plazma-assisted CVD, as in the first embodiment above.

Figure 6C:
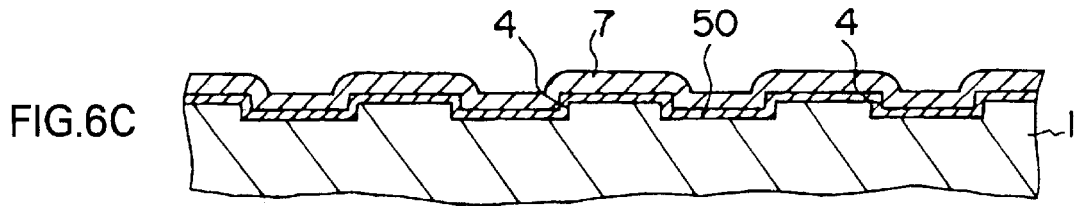

Then, as shown in FIG. 6C, a single-crystal silicon layer 7 having a thickness of several micrometers to 0.005 μm (for example, 0.1 μm) is deposited on the crystalline sapphire layer 50 by CVD using a catalyst in which the temperature of the substrate is 200–600° C., as in the first embodiment.

Thus, silicon is grown epitaxially on the crystalline sapphire layer 50 as a seed to form the single-crystal silicon layer 7 having a thickness of, for example, about 0.1 μm.

The single-crystal silicon layer 7, as set forth in the first embodiment, has the (100)-surface grown heteroepitaxially on the crystalline sapphire layer 50, which is further assisted by the existence of the steps 4. The steps 4 serves as seeds to start epitaxial growth, which is a well-known phenomenon called graphoepitaxial growth (see References 6, 7 and 8 above). Heteroepitaxial growth combined with this phenomenon achieves the single-crystal silicon layer 7 with more improved crystalline structure.

Figure 10A:
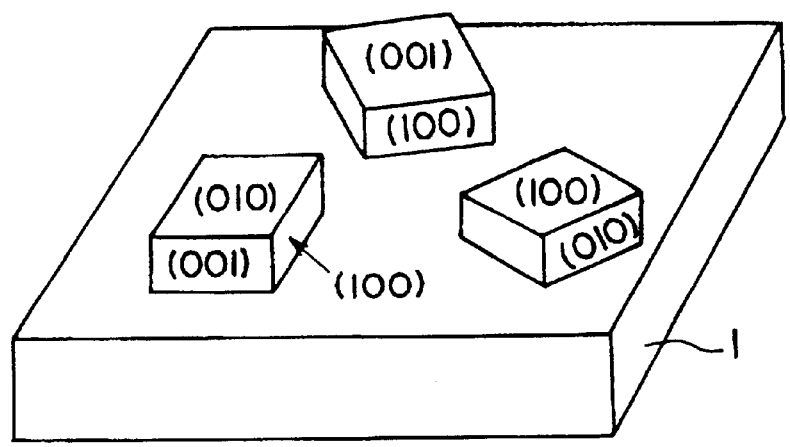
FIG. 10A and FIG. 10B are schematic perspective views illustrating silicon crystal growth on an amorphous substrate.
Figure 10B:
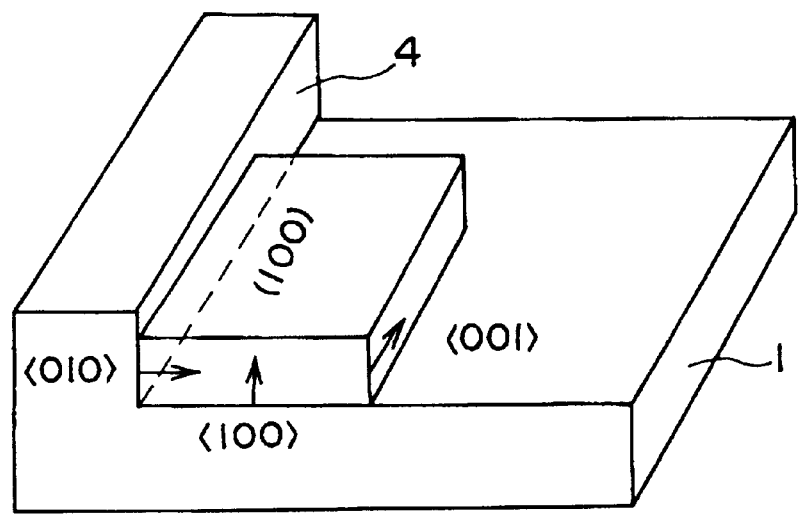
Figure 11A:
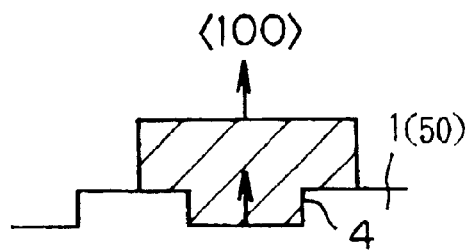
FIGS. 11A to 11F are schematic sectional views illustrating steps in various forms and the crystal orientation of silicon crystal grown thereon in graphoepitaxy.
Figure 11B:
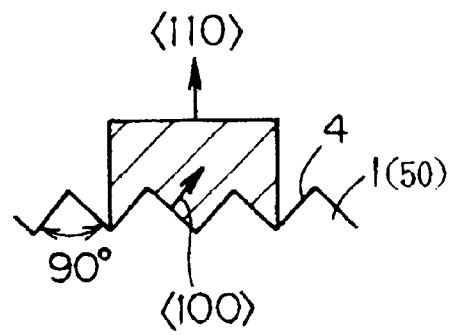
Figure 11C:
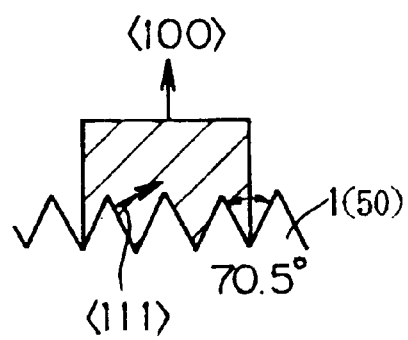
Figure 11D:
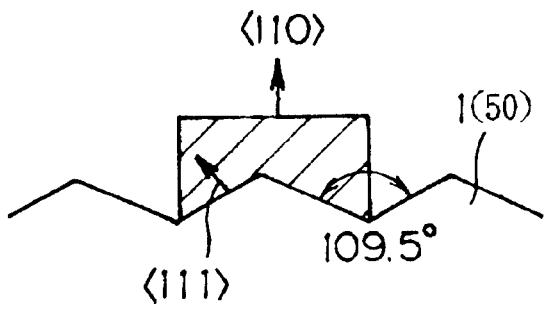
Figure 11E:
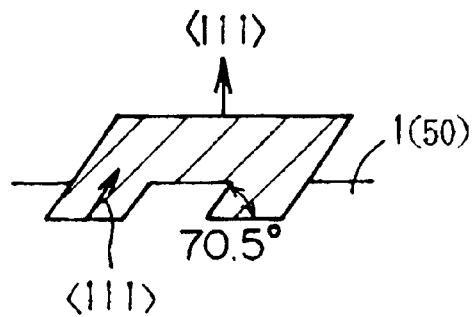
Figure 11F:
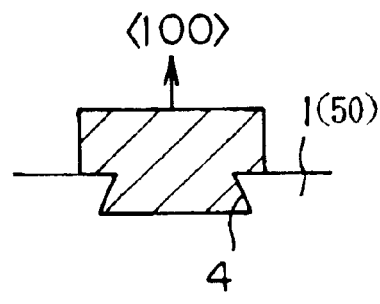

As seen from FIG. 10A, the layers are in random orientations. However, the deposition of an epitaxial layer on the amorphous substrate (glass) 1 having the step 4 with a vertical wall causes the layer to grow with its (100)-surface along the vertical wall of the step 4, as shown in FIG. 10B. The size of the single-crystal grain increases in proportion to temperature and time. In the case of deposition with a lower temperature and a shorter time, the space between the steps should be reduced.

The crystal orientation of a layer to be grown can be controlled by changing the form of the steps in various forms as shown in FIGS. 11A to 11F. In most cases, MOS transistors are fabricated on (100)-surfaces. In the cross section of the step 4, the angle at the lower corner may be a right angle, or alternatively, the step 4 may be sloped from the top toward the base inwardly or outwardly. In short, it is sufficient that the step 4 has a surface extending in a particular direction causing crystal growth easily. Preferably, the angle at the lower corner of the step 4 is smaller than or equal to 90° and the corner of the bottom surface has a slight curvature.

After the deposition of the single-crystal silicon layer 7 on the substrate 1 by means of a lattice match with the crystalline sapphire layer 50 and graphoepitaxy, a MOS transistor (TFT) is fabricated with the single-crystal silicon layer 7 used as a channel region.

Figure 7A:
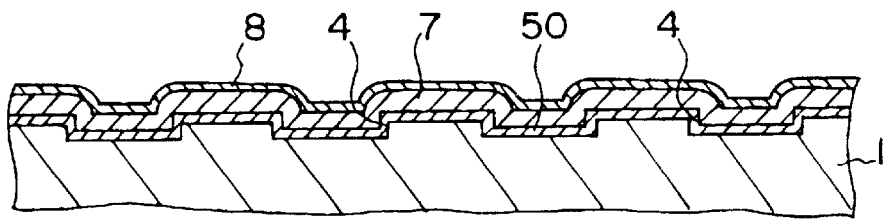
FIGS. 7A to 7C are sectional views illustrating steps of the manufacturing process continued from FIG. 6C in order.
Figure 7B:
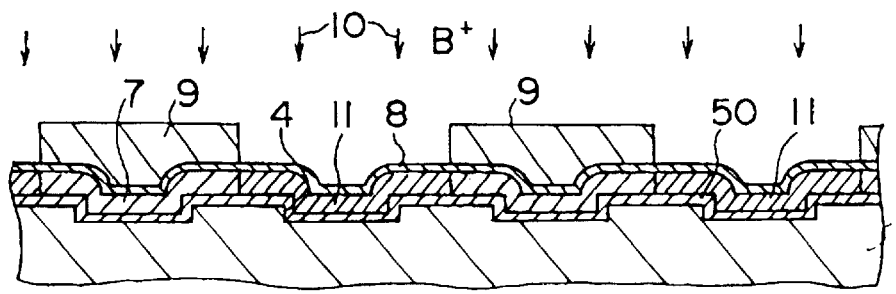

As shown in FIG. 7A, a gate oxide film 8 having a thickness of 350 Å is formed on the surface of the single-crystal silicon layer 7 by oxidation (950° C.). Next, as shown in FIG. 7B, in order to control the impurity concentration of a channel region for an N-channel MOS transistor, a region for a P-channel MOS transistor is masked with photoresist 9, and P-type impurity ions (for example, B⁺) 10 of, for example, 10 kV is implanted with a dose of, for example, 2.7×10¹¹ atoms/cm² to form a silicon layer 11, which is obtained by making the conductive type of the single-crystal silicon layer 7 P-type.

Figure 7C:
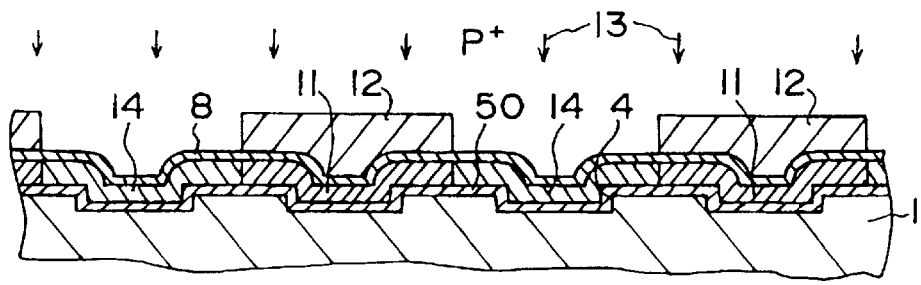

Then, as shown in FIG. 7C, in order to control the impurity concentration of a channel region for an P-channel MOS transistor, a region for an N-channel MOS transistor is masked with photoresist 12, and N-type impurity ions (for example, P⁺) 13 of, for example, 10 kV is implanted with a dose of, for example, 1×10¹¹ atoms/cm² to form a silicon layer 14, which is obtained by making the conductive type of the single-crystal silicon layer 7 N-type.

Figure 8A:
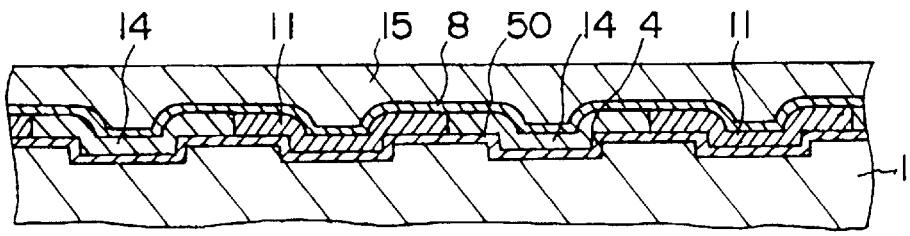
FIGS. 8A to 8C re sectional views illustrating steps of the manufacturing process continued from FIG. 7C in order.
Figure 8B:
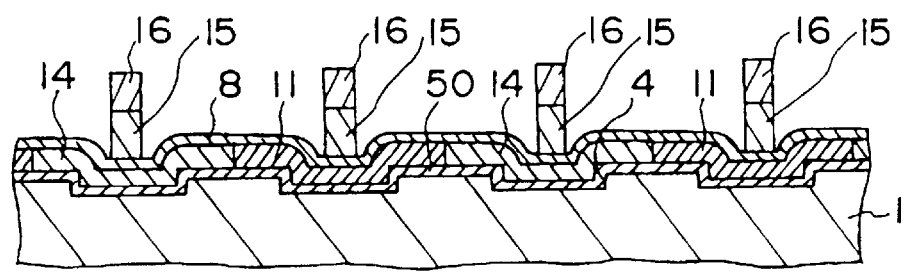
Figure 8C:
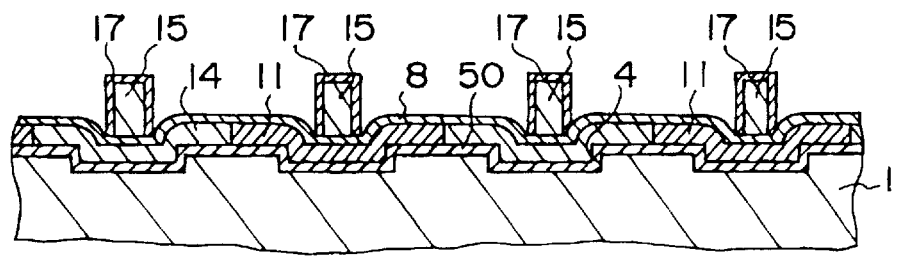

After that, as shown in FIG. 8A, a phosphorus-doped polysilicon layer 15, as a material for a gate electrode, having a thickness of 4000 Å is deposited by CVD (at a temperature of 620° C.). Then, as shown in FIG. 8B, photoresist 16 is formed in a predetermined pattern and the polysilicon layer 15 is patterned into the form of a gate electrode with the photoresist 16 used as a mask. After removing the photoresist 16, as shown in FIG. 8C, an oxide film 17 is formed on the surface of the gate polysilicon layer 15 through oxidation in an $O_2$ atmosphere at 900° C. for 60 minutes.

Figure 9A:
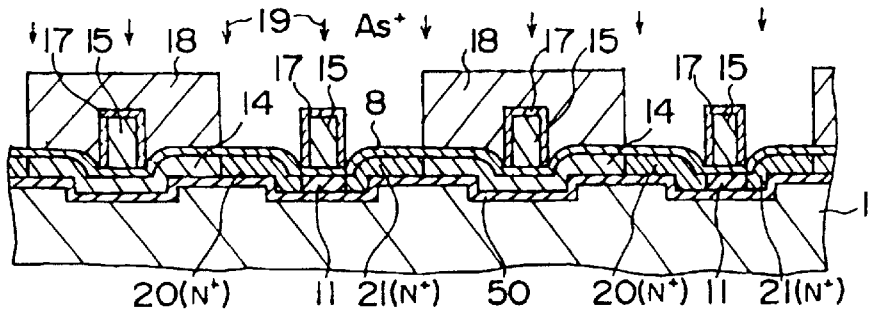
FIGS. 9A to 9D are sectional views illustrating steps of the manufacturing process continued from FIG. 8C in order.

Then, as shown in FIG. 9A, the region for a P-channel MOS transistor is masked with photoresist 18, and N-type impurities such as $As^+$ ions 19 of, for example, 20 kV are implanted with a dose of, for example, $5 \times 10^{15}$ atoms/cm$^2$. Then, an $N^+$-type source region 20 and a drain region 21 of an N-channel MOS transistor are formed through annealing in an $N_2$ atmosphere at 950° C. for 40 minutes.

Figure 9B:
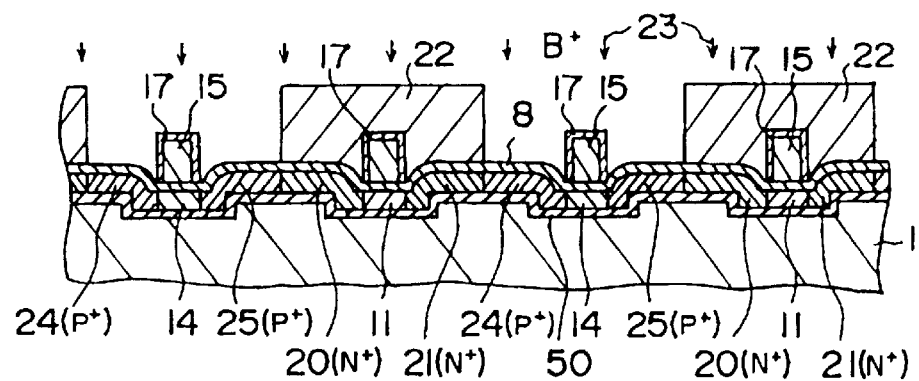

Then, as shown in FIG. 9B, the region for an N-channel MOS transistor is masked with photoresist 22, and P-type impurities such as Be ions 23 of, for example, 10 kV are implanted with a dose of, for example, $5 \times 10^{15}$ atoms/cm$^2$. Then, a P-type source region 24 and a drain region 25 of a P-channel MOS transistor are formed through annealing in an $N_2$ atmosphere at 900° C. for 5 minutes.

Figure 9C:
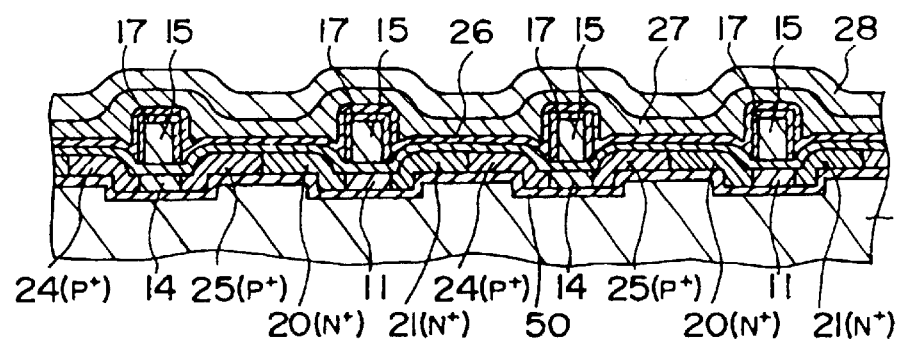

Next, as shown in FIG. 9C, over the entire surface of the wafer, by CVD, a $SiO_2$ film 26 having a thickness of 500 Å is deposited at a temperature of, for example, 750° C., and a SiN film 27 having a thickness of 2000 Å is deposited at a temperature of, for example, 420° C. In addition, a boron-phosphorous-doped silicate glass (BPSG) film 28 having a thickness of 6000 Å is armed as a reflow film at, for example, 450° C. and then the BPSG film 28 is reflowed in a $N_3$ atmosphere at 900° C., for example.

Figure 9D:
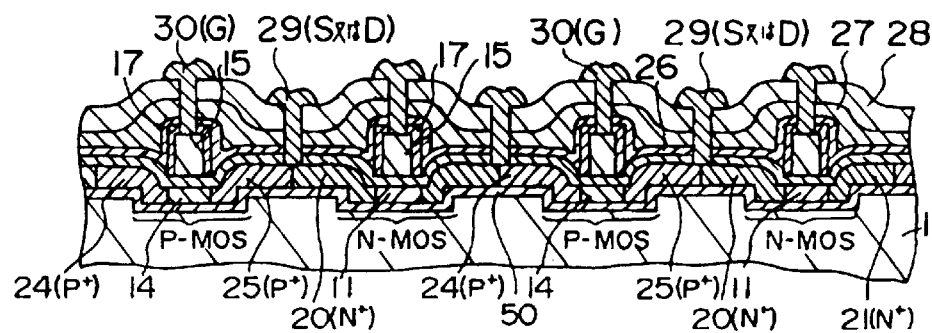

Lastly, as shown in FIG. 9D, contact windows are opened in predetermined positions in an insulating film, and then over the entire surface with the holes opened therein, a film made of a material for electrodes such as aluminum and having a thickness of 1 μm is deposited by sputtering at 150° C. and patterned to form source and drain 30 (G) of electrodes 29 (S and D) and a gate electrode or wiring 30 (G) of each of a channel MOSTFT and an N-channel MOSTFT. Thus, each MOS transistor is completed.

In the present embodiment, the step 4 is formed on the insulating substrate 1. This enhances the effects and advantages obtained in the first embodiment, achieving the satisfactory epitaxial growth of a single-crystal silicon layer with more improved crystalline structure.

Third Embodiment

Description will now be made with respect to a third embodiment of the invention.

In the first embodiment as described above, an insulating substrate with a crystalline sapphire layer formed thereon is used as a substrate. In contrast, the present embodiment involves the adoption of a single-crystal silicon substrate (or a silicon wafer) and the epitaxial growth of a single-crystal silicon layer thereon by CVD using a catalyst as described above.

Specifically, in the present embodiment, a silicon epitaxial layer having a thickness of, for example, 1.2 μm is formed at low temperatures by CVD using a catalyst with use of the CVD system using a catalyst as shown in FIG. 5 though the following procedure.

A silicon wafer is cleaned and a thin oxide film on the surface thereof is removed using a dilute hydrofluoric acid (1–5% solution in water). Then the silicon wafer is cleaned with pure water and dried.

Next, the silicon wafer is mounted on a support (usually, SiC-coated graphite susceptor at a temperature of 200° C.) through a load-lock chamber. The support is capable of control of the temperature in the chamber in the CVD system using a catalyst (see FIG. 5).

Then the pressure in the chamber is reduced to the order of $1-2 \times 10^{-6}$ Pa. and particularly water/oxygen introduced in the chamber is exhausted (for about 5 minutes). After that, hydrogen is allowed to flow into the chamber. The flow rate of hydrogen, the pressure in the chamber and the susceptor temperature are controlled to prescribed values as follows:

Pressure in the chamber: in the order of 0.1–15 Pa
  (in the embodiment, set at 1.0 Pa.)
Susceptor temperature: 200–600° C.
  (in the embodiment, set at 200° C.)
Flow rate of hydrogen: set at 90 sccm/min Next, the catalyst body (for example, a tungsten wire) is heated up to, for example, about 1600–1800° C. (in this embodiment, 1800° C.) and maintained for 10 minutes. In this case, isolated hydrogen atoms or hydrogen atoms in clusters having high energy, which are activated by a heated metal catalyst, etch a silicon oxide film at low temperatures. Thus, a thin natural oxide film (having a thickness of 15–18 Å) can be etched away at low temperatures and removed off. It has been confirmed that the etching rate of a silicon oxide film formed at elevated temperatures is in the order of 15–20 Å/20 minutes at 200° C. Therefore, such a natural oxide film can be completely removed.

Then, hydrogen flowing in MFC (Mass Flow Controller) for $SiH_4$ is replaced with $SiH_4$ to allow a single-crystal silicon layer having a predetermined thickness to be grown epitaxially by CVD using a catalyst under the following conditions. The thickness of the single-crystal silicon layer to be deposited is 1.2 μm, and therefore, the following gases for reactions are allowed to flow in the chamber for exactly 20 minutes:

Flow rate of hydrogen: 90 sccm/min.
Flow rate of $SiH_4$: 9 sccm/min. (100% silane)
Deposition rate: 600 Å/min.
Temperature of catalyst body: 1800° C.
Wafer temperature: 200° C.

After completion of growth of the single-crystal layer, the flow rate of $SiH_4$ is reduced to zero. Five minutes later, power to the catalyst is shut off to reduce the temperature thereof. Then the flow rate of hydrogen is reduced to zero and the pressure in the chamber is reduced to about $1-2 \times 10^{-6}$ Pa. Particularly $SiH_4$ introduced in the chamber is exhausted (for about 5 minutes). After that, the wafer is taken out to the outside at atmospheric pressure through the load-lock chamber.

According to the present embodiment, in addition to the effects and advantages of the first embodiment, single-crystal silicon can be grown at low temperatures, preventing auto-doping of impurities to simplify the process (specifically, a step of sealing the back of a high-concentration substrate is no longer necessary). Moreover, the present embodiment provides an advantage of the improved quality of a silicon epitaxial layer. Specifically, a decrease in diffusion of impurities contributes to more precise control of the concentration and the thickness of a silicon epitaxial layer. Besides, auto-doping of aluminum can be completely suppressed.

The use of a sapphire bulk substrate instead of a single-crystal silicon substrate can also attain the epitaxial growth of a single-crystal silicon layer on a sapphire substrate through the same process as described above, except that a single-crystal silicon layer has a thickness of 0.1 μm and that the gases for reactions above should be allowed to flow for 166 seconds.

Fourth Embodiment

Description will now be made with respect to a fourth embodiment by referring to FIG. 12 to FIG. 14.

The present embodiment discloses a silicon epitaxial layer obtained through a procedure similar to the third embodiment, a comparison of a case with a natural oxide film and a case without a natural oxide film, and an example of a case with a sapphire bulk substrate (for SOS (Silicon on Sapphire) or others).

The samples are single-crystal silicon grown epitaxially under the following conditions. The samples 4 and 5 are subjected to a treatment using hydrogen to remove a natural oxide film prior to silicon epitaxial growth.

Sample-1

Silicon wafer with a crystal orientation of (111) 3° off, 5 inches in diameter, bear surface (with a natural oxide film formed thereon, 18 Å in thickness: no treatment of activation using a catalyst and no treatment using hydrogen)

| Deposition conditions: | |
|---|---|
| Flow rate of gases: | SiH$_4$ 1.5 SCCM/H$_2$ 90 SCCM |
| Pressures of gases: | 12 Pa |
| Deposition time: | 30 minutes |
| Dimensions of catalyst body: | 0.65 mmΦ |
| Temperature of catalyst body: | 1650–1700° C. (about 1500 W) |
| Temperature of substrate holder: | 200–280° C. |

Sample-2

Silicon wafer with a crystal orientation of (111) 3° off, 5 inches in diameter, bear surface (with a natural oxide film formed thereon, 18 Å in thickness: no treatment of activation using a catalyst and no treatment using hydrogen)

| Deposition conditions: | |
|---|---|
| Flow rates of gases: | SiH$_4$ 3.0 SCCM/H$_2$ 90 SCCM |
| Pressures of gases: | 12 Pa |
| Deposition time: | 30 minutes |
| Temperature of catalyst body: | 1650–1700° C. (55.4 V, 9.1 A, 504 W) |
| Temperature of substrate holder: | 200° C. |

Sample-3

Silicon wafer with a crystal orientation of (111) 3° off, 5 inches in diameter, bear surface (with a natural oxide film formed thereon, 18 Å in thickness: no treatment of activation using a catalyst and no treatment using hydrogen)

| Deposition conditions: | |
|---|---|
| Flow rate of gases: | SiH$_4$ 4.5 SCCM/H$_2$ 90 SCCM |
| Pressures of gases: | 16 Pa |
| Deposition time: | 20 minutes |
| Temperature of catalyst body: | 1650–1700° C. 55.4 V, 9.1 A, 504 W) |
| Temperature of substrate holder: | 200° C. |

Sample-4

Silicon wafer with a crystal orientation of (100) 0° off, 5 inches in diameter, bear surface (with a natural oxide film formed thereon, 18 Å in thickness: removed through a treatment of activation using a catalyst and a treatment using hydrogen)

Treatment using hydrogen:
H$_2$ 90 SCCM+temperature of catalyst body 1800° C.×10 min.

Deposition conditions:

Flow rates of gases: SiH$_4$ 9.0 SCCM/H$_2$ 90 SCCM

Pressures of gases: 10 Pa

Deposition time: 20 minutes

Temperature of catalyst body: 1800° C. (750 W)

Dimensions or others of catalyst body: 0.4 mm Φ

Temperature of substrate holder: 200° C.

Sample-5

Sapphire wafer with a crystal orientation of (1102) 0° off, 4 inches in thickness Treatment using hydrogen:
H$_2$ 90 SCCM+temperature of catalyst body 1800° C.×10 min.

Deposition conditions:

Flow rates of gases: SiH$_4$ 9.0 SCCM/H$_2$ 90 SCCM

Pressures of gases: 10 Pa

Deposition time: 6 min., about 300–400 nm in film thickness

Temperature of catalyst body: 1800° C. (750 W)

Dimensions or others of catalyst body: 0.4 mm Φ

Temperature of substrate holder: 200° C.

Figure 12:
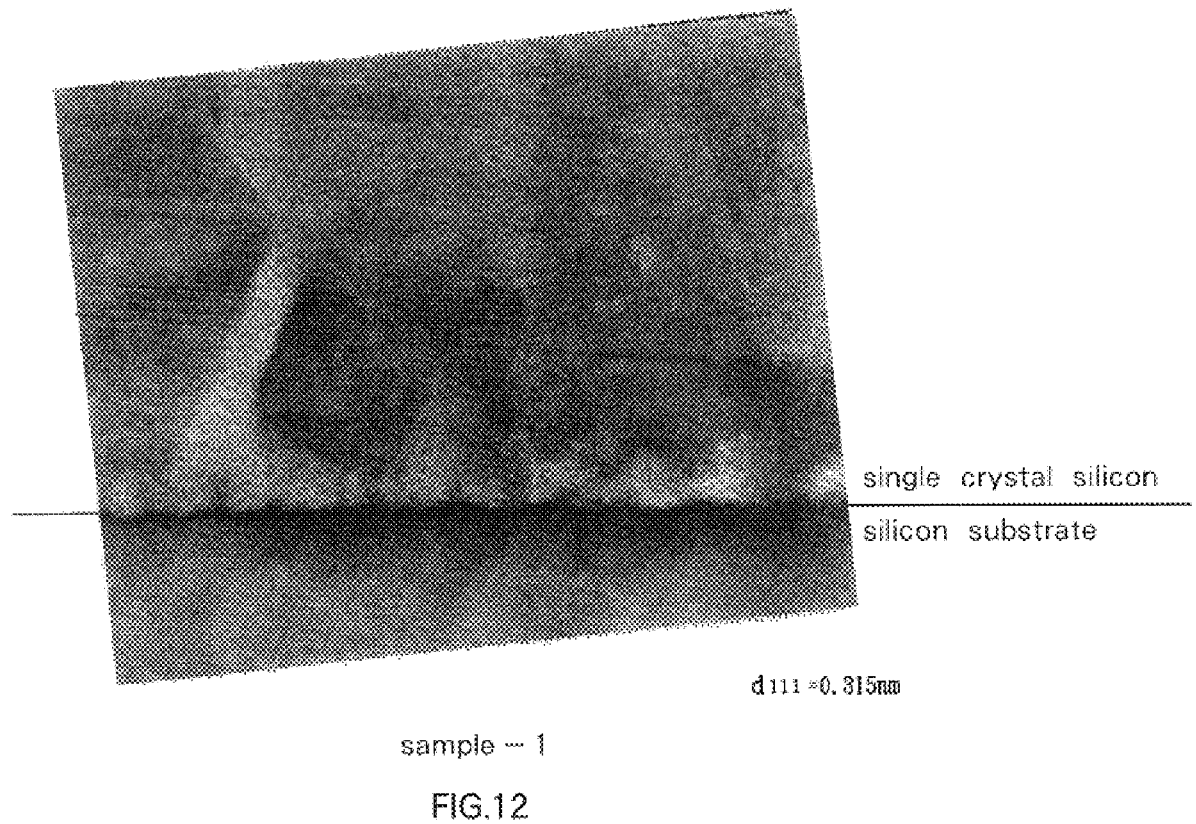
FIG. 12 is a photograph showing a single-crystal silicon layer on a substrate according to a fourth embodiment of the invention.
Figure 13:
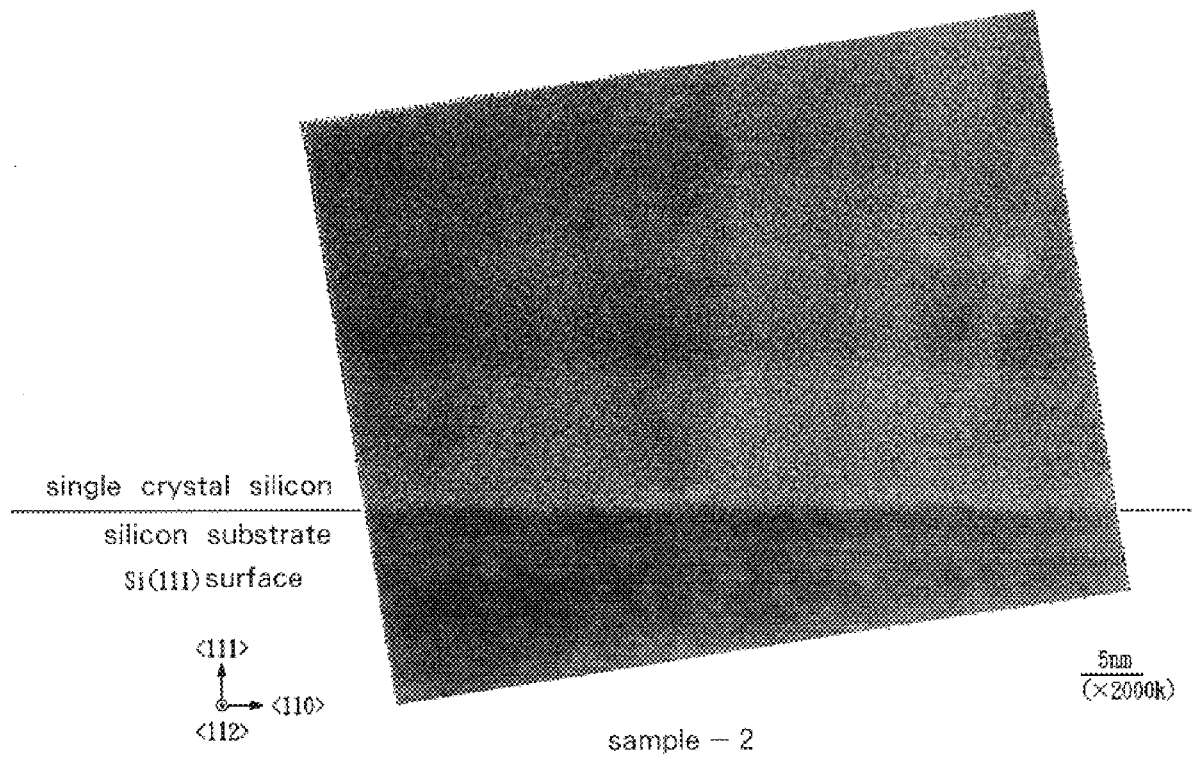
FIG. 13 is a photograph showing a single-crystal silicon layer on a substrate according to a fourth embodiment of the invention.
Figure 14:
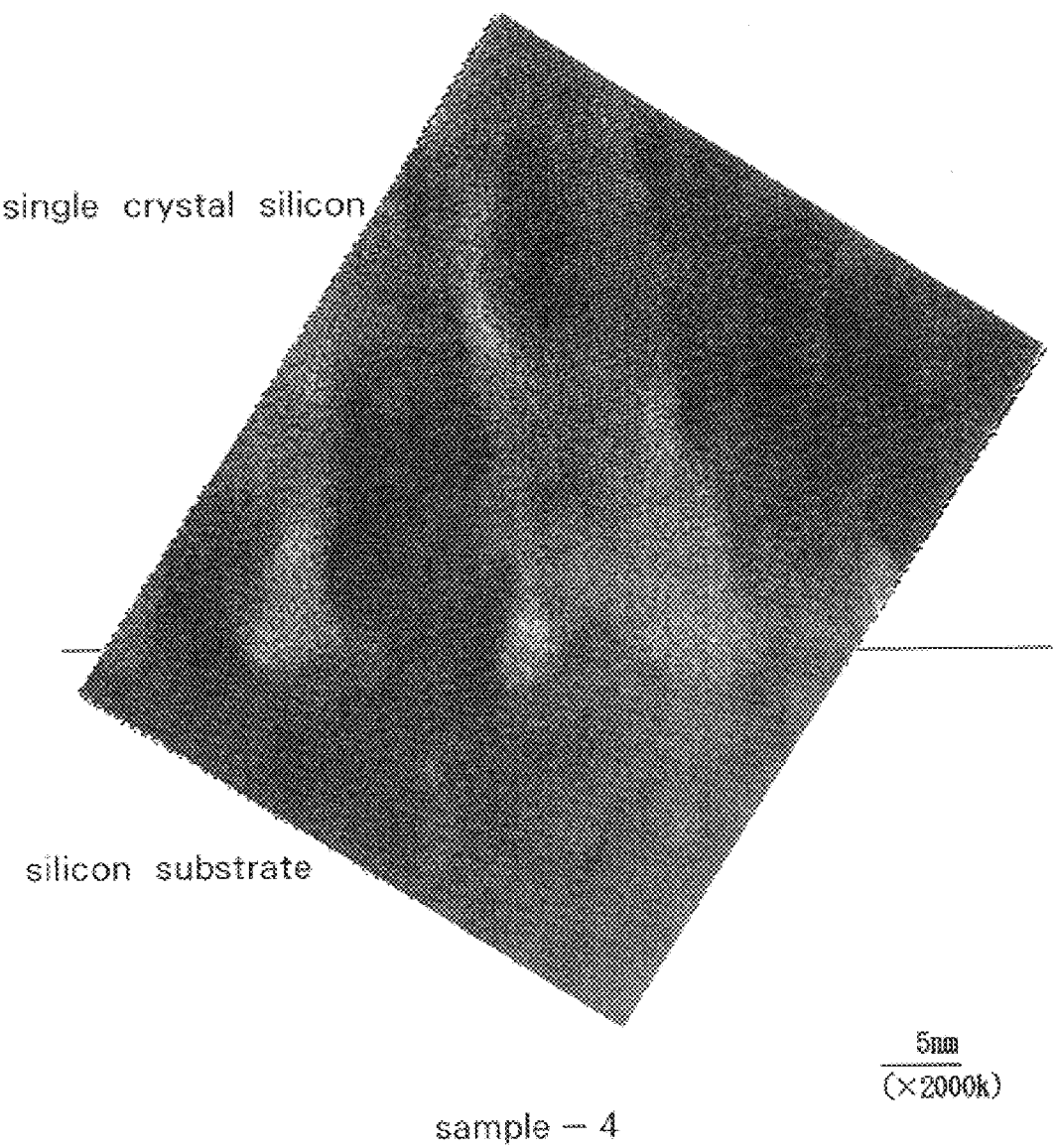
FIG. 14 is a photograph showing a single-crystal silicon layer on a substrate according to a fourth embodiment of the invention.

FIG. 12 to FIG. 14 show evaluation results (photographs) of the sections of silicon epitaxial layers by means of TEM (transmission electron microscope) with respect to sample-1, sample-2 and sample-4, respectively.

As is obvious from the results of sample-1 and sample-2, the single-crystal silicon layers, which are formed on silicon substrates with crystal orientations of (111) 30 off, with natural oxide films (about 18 Å in thickness each) formed thereon, are oriented in (111) 30 off, as are the substrates. This is the case in sample-3.

In sample-1, most of the single-crystal silicon layer is oriented in the same orientation as the substrate, or comprised of twin crystals with the (111)-surface of the substrate as a symmetry plane. That is, the layer is mostly comprised of crystals having (111)-surfaces in the same orientation as the (111)-surface of the substrate. The layer, however, includes (111)-oriented twin crystal structures which do not have the same crystal structure as the substrate, or slightly includes polycrystal structures.

In sample-2 the crystal silicon layer is grown under the influence of the crystal orientation of the substrate Si, and most of the layer is comprised of crystals having (111)- surfaces in the same orientation as the (1)-surface of the substrate. The layer is comprised of columnar structures extending nearly perpendicular to the substrate, and each "column" (grain) is formed of (111)-oriented twin crystal structures laid one upon the other.

Sample-4 adopts a silicon substrate with a crystal orientation of (100) 0° off, with a natural oxide fin (about 18 Å in thickness) formed thereon. As seen from sample4, the natural oxide film is removed a treatment of activation using a catalyst and a treatment using hydrogen through. It is obvious that the single-crystal silicon layer formed thereon has the same orientation of (100) 0° off as the substrate. The surface of the single-crystal silicon layer is as smooth as that of a single-crystal silicon substrate.

The single-crystal silicon layer of sample-4 is comprised of columnar structures formed of Si (100)-oriented twin crystal structures laid one upon the other. At the interface of the columnar grain and the Si substrate, the crystals of the columnar grain is grown with excellent continuity, closely matching with the Si crystals of the substrate, which obviously indicates that the epitaxial growth occurs under a condition where the substrate holder is kept at a temperature as low as 200° C. The epitaxial growth, however, is not found on the entire surface of the Si substrate, but densely found in an area several nanometers in widths of the surface of the substrate. This may be considered a reason for the formation of the columnar structures. In areas where the epitaxial growth is not found, an island-like interface, which seems to be an amorphous layer, is found.

The single-crystal silicon layers obtained in sample-1 to sample3, and even in sample-4 are not perfect single-crystal thin films, but some defects are partly found. The possible reason may be that oxygen or water is mixed in gases for reactions and the mixed oxygen is deposited in the neighborhood of the grain boundary.

The single-crystal silicon layer formed in sample-6 has an orientation of (110) 0° off. The surface of the layer is as smooth as a commercially available SOS substrate. The treatment of sample-5 using hydrogen prior to deposition of single-crystal silicon eliminates strains on the substrate caused by processing of the substrate or removes contaminates (such as organic compounds and oxides) attached to the substrate. Thus, an ideal sapphire crystal layer is exposed in the surface, thereby achieving the satisfactory epitaxial growth of the single-crystal silicon layer.

Obviously, the embodiments of the present invention described above can be variously changed or modified based on the technical idea of the present invention.

For example, instead of using crystalline sapphire ($Al_2O_3$), a spinel structure (for example, magnesia spinel ($MgO.Al_2O_3$)) or calcium fluoride ($CaF_2$), having an excellent lattice match with single-crystal silicon, can be used.

The base for the epitaxial growth of single-crystal silicon may be a single-crystal silicon layer instead of a crystalline sapphire layer. In this case, a substrate of an SOI (Silicon on insulator) structure can be used to grow single-crystal silicon epitaxially thereon. The present invention is not limited to the cases of the epitaxial growth on other thin films having an excellent lattice match with single-crystal silicon as the above-mentioned thin films. The present invention, however, can be applied to the cases of the epitaxial growth on a bulk made of the above-mentioned materials (i.e., a sapphire wafer as mentioned above, or a wafer made of a single-crystal semiconductor such as silicon or germanium).

The steps 4 can be formed not only on the substrate 1 but also on a sapphire layer having a thickness shown by phantom line in FIG. 6A. The steps 4 may be also formed on the sapphire substrate itself.

As described above, the present invention involves deposition of single-crystal silicon on a seeding layer made of a material having a lattice match with single-crystal silicon or a single-crystal silicon substrate as a seed by CVD using a catalyst. This enables the formation of the seeding layer at low temperatures, making it possible to form a single-crystal silicon layer uniformly at low temperatures because the heating treatment in the process of silicon epitaxial growth can be conducted at low temperatures.

Therefore, it becomes possible to use a substrate easily and cheaply available and excellent in properties, such as a glass substrate having a relatively low strain point, a ceramic substrate or a single-crystal silicon substrate. Besides, it becomes possible to use a larger substrate. The seeding layer such as a crystalline sapphire layer serves as a barrier to diffusion of various atoms, suppressing diffusion of impurities from a glass substrate. Moreover, the electron mobility in a single-crystal silicon layer is as big as 540 $cm^2/v·sec$, which is equivalent to that of a single-crystal silicon substrate. Therefore, it becomes possible to fabricate a high-speed transistor of a large current density, a high-performance semiconductor element such as a diode, a capacitor, a resistor, or an integrated circuit on a glass substrate.

Moreover, single-crystal silicon can be grown at low temperature, preventing auto-doping of impurities to simplify the procedure (specifically the step of sealing the back of a high-concentration substrate is no longer necessary). A decrease in diffusion of impurities contributes to an improvement in the quality of a silicon epitaxial layer. Furthermore, low substrate temperatures can reduce heating power requirements. Also, a cooling mechanism can be simplified, making a silicon epitaxy system cheaper. In addition, large reaction efficiency of reaction gases such as silane saves resources and has a low impact on the environment. This also contributes to a cost reduction.

INDUSTRIAL APPLICABILITY

As described above, a method of forming a single-crystal silicon layer and a method of manufacturing a semiconductor device enable the uniform epitaxial growth of a silicon layer at a low temperature even on a large glass substrate having a relatively low strain point, being suitable for manufacturing a high-speed semiconductor element of a large current density thereon.

From the above description, it is apparent that the objects of the present invention have been achieved. While only certain embodiments have been set forth, alternative embodiments and various modifications will be apparent from the above description to those skilled in the art. These and other alternatives are considered equivalents and within the spirit and scope of the present invention.

What is claimed is:

1. A method of forming a single-crystal silicon layer, comprising the step of forming a single-crystal silicon layer on a seeding layer by CVD using a catalyst, the seeding layer comprising a material having a lattice match with single-crystal silicon.

2. A method of forming a single-crystal silicon layer according to claim 1, wherein the step of forming the single-crystal silicon layer is carried out at temperature range of 100–700° C.

3. A method of forming a single-crystal silicon layer according to claim 1, wherein the step of forming the single-crystal silicon layer further comprises decomposing a gas containing comprising silicon hydride through contact with a heated catalyst body to cause the single-crystal silicon layer to be deposited on a substrate.

4. A method of forming a single-crystal silicon layer according to claim 3, wherein the silicon hydride is silane and the catalyst body comprises a material selected from the group consisting of tungsten, tungsten containing thorium oxide, molybdenum, platinum, palladium, silicon, alumina, ceramics with metal attached thereto, and silicon carbide.

5. A method of forming a single-crystal silicon layer according to claim 1, wherein the seeding layer comprises a material selected from the group consisting of sapphire, spinel structure and calcium fluoride.

6. A method of forming a single-crystal silicon layer according to claim 1, wherein the seeding layer comprises a single-crystal semiconductor.

7. A method of forming a single-crystal silicon layer according to claim 6, wherein the step of forming the single-crystal silicon layer is carried out after removing an oxide film on a surface of the seeding layer.

8. A method of forming a single-crystal silicon layer according to claim 6, wherein, before forming the single-crystal silicon layer by CVD using a catalyst, an oxide film is removed by etching with an etchant of hydrogen atoms activated through contacting hydrogen gas with a heated catalyst body.

9. A method of forming a single-crystal silicon layer according to claim 8, wherein the catalyst body comprises a material selected from the group consisting of tungsten, tungsten containing thorium oxide, molybdenum, platinum, palladium, silicon, alumina, ceramics with metal attached thereto, and silicon carbide.

10. A method of forming a single-crystal silicon layer according to claim 1, wherein the seeding layer is formed on an insulating substrate.

11. A method of forming a single-crystal silicon layer according to claim 10, wherein the insulating substrate is a glass substrate.

12. A method of forming a single-crystal silicon layer according to claim 1, wherein the step of forming the single-crystal silicon layer further comprises doping the single-crystal silicon layer with a III-group or V-group element as an impurity, to control an impurity type and/or an impurity concentration of the single-crystal silicon layer.

13. A method of forming a single-crystal silicon layer according to claim 1, further comprising the following step prior to the step of forming the single-crystal silicon layer:
    forming a step on the substrate to act as a seed to start epitaxial growth of the single-crystal silicon layer, and the seeding layer is formed on the substrate with the step formed thereon.

14. A method of forming a single-crystal silicon layer according to claim 13, wherein the step is formed by dry etching.

15. A method of forming a single-crystal silicon layer according to claim 1, further comprising the following step prior to the step of forming the single-crystal silicon layer:
    forming a step on the seeding layer to act as a seed to start epitaxial growth of the single-crystal silicon layer.

16. A method of forming a single-crystal silicon layer according to claim 15, wherein the step is formed by dry etching.

17. A method of manufacturing a semiconductor device comprising steps of:
    forming a single-crystal silicon layer on a seeding layer by CVD using a catalyst, the seeding layer comprising; and
    fabricating a semiconductor element through a predetermined treatment of the single-crystal silicon layer.

18. A method of manufacturing a semiconductor device according to claim 17, wherein the single-crystal silicon layer is used for a channel region, a source region and a drain region of an insulated gate field effect transistor to control a III-group or V-group impurity type and/or an impurity concentration of each of the regions.

19. A method of manufacturing a semiconductor device according to claim 17, wherein the step of forming the single-crystal silicon layer is carried out at a temperature range of 100–700° C.

20. A method of manufacturing a semiconductor device according to claim 17, wherein the step of forming the single-crystal silicon layer further comprises decomposing a gas comprising silicon hydride through contact with a heated catalyst body to cause the single-crystal silicon layer to be deposited on a substrate.

21. A method of manufacturing a semiconductor device according to claim 20, wherein the silicon hydride is silane and the catalyst body comprises a material selected from the group consisting of tungsten, tungsten containing thorium oxide, molybdenum, platinum, palladium, silicon, alumina, ceramics with metal attached thereto, and silicon carbide.

22. A method of manufacturing a semiconductor device according to claim 17, wherein the seeding layer comprises a material selected from the group consisting of sapphire, spinel structure and calcium fluoride.

23. A method of manufacturing a semiconductor device according to claim 17, wherein the seeding layer comprises a single-crystal semiconductor such as single-crystal germanium.

24. A method of manufacturing a semiconductor device according to claim 23, wherein the step of forming the single-crystal silicon layer is carried out after a step of removing an oxide film from a surface of the seeding layer.

25. A method of manufacturing a semiconductor device according to claim 24, wherein the oxide film is removed by etching with an etchant of hydrogen atoms activated through contacting hydrogen gas with a heated catalyst body.

26. A method of manufacturing a semiconductor device according to claim 25, wherein the catalyst body comprises a material selected from a group consisting of tungsten, tungsten containing thorium oxide, molybdenum, platinum, palladium, silicon, alumina, ceramics with metal attached thereto, and silicon carbide.

27. A method of manufacturing a semiconductor device according to claim 17, wherein the seeding layer is formed on an insulating substrate.

28. A method of manufacturing a semiconductor device according to claim 27, wherein the insulating substrate is a glass substrate.

29. A method of manufacturing a semiconductor device according to claim 17, wherein the step of forming the single-crystal silicon layer further comprises doping the single-crystal silicon layer with a III-group or V-group element as an impurity, to control an impurity type and/or an impurity concentration of the single-crystal silicon layer.

30. A method of manufacturing a semiconductor device according to claim 17, further comprising the step of forming a step on the substrate to act as a seed to start epitaxial growth of the single-crystal silicon layer and forming the seeding layer on the substrate with the step previously formed thereon.

31. A method of manufacturing a semiconductor device according to claim 30, wherein the step is formed by dry etching.

32. A method of manufacturing a semiconductor device according to claim 17, wherein a step is formed on the seeding layer to act as a seed to start epitaxial growth of the single-crystal silicon layer.

33. A method of manufacturing a semiconductor device according to claim 32, wherein the step is formed by dry etching.

34. A method of forming a single crystal silicon layer comprising the step of forming a single-crystal layer on a single-crystal silicon substrate by CVD using a catalyst;

wherein the step of forming the single-crystal silicon layer further comprises decomposing a gas comprising silicon hydride through contact with a heated catalyst body to cause the single-crystal silicon layer to be deposited on the single-crystal silicon substrate.

35. A method of forming a single-crystal silicon layer according to claim 34, wherein the step of forming the single-crystal silicon layer is carried out at a temperature range of 100–700° C.

36. A method of forming a single-crystal silicon layer according to claim 34, wherein the silicon hydride is silane and the catalyst body comprises a material selected from the group consisting of tungsten, tungsten containing thorium oxide, molybdenum, platinum, palladium, silicon, alumina, ceramics with metal attached thereto, and silicon carbide.

37. A method of forming a single-crystal silicon layer according to claim 34, wherein the step of forming the single-crystal silicon layer is carried out after a step of removing an oxide film from a surface of the single-crystal silicon substrate.

38. A method of forming a single-crystal silicon layer according to claim 37, wherein the oxide film is removed by etching with an etchant of hydrogen atoms activated through contacting hydrogen gas with a heated catalyst body.

39. A method of forming a single-crystal silicon layer according to claim 38, wherein the catalyst body comprises material selected from the group consisting of tungsten, tungsten containing thorium oxide, molybdenum, platinum, palladium, silicon, alumina, ceramics with metal attached thereto, and silicon carbide.

40. A method of forming a single-crystal silicon layer according to claim 34, wherein the step of forming the single-crystal silicon layer further comprises doping the single-crystal silicon layer with a III-group or V-group element as an impurity, to control an impurity type and/or an impurity concentration of the single-crystal silicon layer.

41. A method of forming a single-crystal silicon layer according to claim 34 further comprising the step of forming a step on the single-crystal silicon substrate to act as a seed to start epitaxial growth of the single-crystal silicon layer.

42. A method of forming a single-crystal silicon layer according to claim 41, wherein the step is formed by dry etching.

43. A method of manufacturing a semiconductor device comprising the steps of:

forming a single-crystal silicon layer on a single-crystal silicon substrate by CVD using a catalyst; and fabricating a semiconductor element through a predetermined treatment of the single-crystal silicon layer;

wherein the step of forming the single-crystal silicon layer further comprises decomposing a gas comprising silicon hydride through contact with a heated catalyst body to cause the single-crystal silicon layer to be deposited on the single-crystal silicon substrate.

44. A method of manufacturing a semiconductor device according to claim 43, wherein the single-crystal silicon layer is used for a channel region, a source region and a drain region of an insulated gate field effect transistor to control a III-group or V-group impurity type and/or an impurity concentration of each of the regions.

45. A method of manufacturing a semiconductor device according to claim 43, wherein the step of forming the single-crystal silicon layer is carried out at a temperature range of 100–700° C.

46. A method of manufacturing a semiconductor device according to claim 43, wherein the silicon hydride is silane and the catalyst body comprises a material selected from a group consisting of tungsten, tungsten containing thorium oxide, molybdenum, platinum, palladium, silicon, alumina, ceramics with metal attached thereto, and silicon carbide.

47. A method of manufacturing a semiconductor device according to claim 43, wherein the step of forming the single-crystal silicon layer is carried out after a step of removing an oxide film from a surface of the single-crystal silicon substrate.

48. A method of manufacturing a semiconductor device according to claim 47, wherein the oxide film is removed by etching with an etchant of hydrogen atoms activated through contacting hydrogen gas with a heated catalyst body.

49. A method of manufacturing a semiconductor device according to claim 48, wherein the catalyst body comprises a material selected from the group consisting of tungsten, tungsten containing thorium oxide, molybdenum, platinum, palladium, silicon, alumina, ceramics with metal attached thereto, and silicon carbide.

50. A method of manufacturing a semiconductor device according to claim 43, wherein the step of forming the single-crystal silicon layer further comprises doping the single-crystal silicon layer with a III-group or V-group element as an impurity, to control an impurity type and/or an impurity concentration of the single-crystal silicon layer.

51. A method of manufacturing a semiconductor device according to claim 43 further comprising the step of forming a step on the single-crystal silicon substrate to act as a seed to start epitaxial growth of the single-crystal silicon layer.

52. A method of manufacturing a semiconductor device according to claim 51, wherein the step is formed by dry etching.

* * * * *